United States Patent
Stephani et al.

[11] Patent Number: 5,989,340
[45] Date of Patent: Nov. 23, 1999

[54] PROCESS AND DEVICE FOR SUBLIMATION GROWING OF SILICON CARBIDE MONOCRYSTALS

[75] Inventors: Dietrich Stephani, Bubenreuth; Johannes Völkl, Erlangen, both of Germany

[73] Assignee: Siemens Aktiengesellschaft, Munich, Germany

[21] Appl. No.: 08/913,278
[22] PCT Filed: Nov. 14, 1995
[86] PCT No.: PCT/DE95/01576
§ 371 Date: Aug. 27, 1997
§ 102(e) Date: Aug. 27, 1997
[87] PCT Pub. No.: WO96/17113
PCT Pub. Date: Jun. 6, 1997

[51] Int. Cl.⁶ ............................ C35B 35/00
[52] U.S. Cl. ............ 117/204; 117/84; 117/106; 117/900
[58] Field of Search ............ 117/84, 89, 106, 117/200, 204, 900

[56] References Cited

U.S. PATENT DOCUMENTS

| | | | |
|---|---|---|---|
| 2,854,364 | 9/1958 | Lely | 117/84 |
| 4,147,572 | 4/1979 | Vodakov et al. | 148/175 |
| 5,288,326 | 2/1994 | Maeda et al. | 118/719 |
| 5,667,587 | 9/1997 | Glass et al. | 117/200 |
| 5,704,985 | 1/1998 | Kordina et al. | 118/725 |
| 5,707,446 | 1/1998 | Völkl et al. | 117/200 |
| 5,792,257 | 8/1998 | Kordina et al. | 117/90 |

FOREIGN PATENT DOCUMENTS

| | | |
|---|---|---|
| 0 554 047 A1 | 8/1993 | European Pat. Off. |
| 24 09 005 | 9/1975 | Germany. |
| 42 65294 | 9/1992 | Japan. |

OTHER PUBLICATIONS

Lilov, S., "Investigation of the Role of Crystal Growth Zone during Silicon Carbide Growth by the Sublimation Method," Cryst. Res. Technol. 29 (1994) 1, pp. 69–75.

Vodakov, Y., Epitaxial Growth of Silicon Carbide Layers by Sublimation "Sandwich Method" (I), Kristall und Technik, Bd. 14, Nr. 6, 1979, Berlin, DE, pp. 729–740.

Ivanov, P. et al., "Recent developments in SiC single–crystal electronics," Semiconductor Science and Technology (1992), No. 7. Bristol, GB, pp. 863–880.

*Primary Examiner*—Felisa Hiteshew
*Attorney, Agent, or Firm*—Kenyon & Kenyon

[57] ABSTRACT

A reaction chamber (2) is enclosed by a gas-tight wall (20), made of silicon carbide obtained by a CVD process at least on the inside (21) facing the reaction chamber (2). At least part of the silicon carbide of the wall (20) is sublimated and grown on a seed crystal (3) as a silicon carbide monocrystal (4).

11 Claims, 6 Drawing Sheets

PROCESS AND DEVICE FOR SUBLIMATION GROWING OF SILICON CARBIDE MONOCRYSTALS

BACKGROUND OF THE INVENTION

The invention concerns a process and a device for producing silicon carbide monocrystals.

For sublimation growing of silicon carbide monocrystals from silicon carbide (SiC), a certain amount of silicon carbide, usually in powdered form or in the form of a pre-manufactured solid SiC crystal, is heated and at least partially sublimated in a storage area. The sublimated SiC is made to grow on a SiC seed crystal located in a reaction chamber. Due to the high temperatures required for sublimation growing, in general over 2000° C., the walls surrounding the storage area and the reaction chamber are usually made of refractory materials such as graphite or metal carbides. However, as it travels between the storage area and the seed crystal, sublimated SiC in the gaseous phase unavoidably comes into contact with the container walls. This may cause the impurities contained in the materials of the container walls to be removed by the silicon-rich SiC gaseous phase and end up in the growing SiC monocrystal. Furthermore, the stoichiometric composition of the SiC in the gaseous phase can change through chemical reactions of silicon in the SiC gaseous phase with the graphite or metal carbide walls. This can result in carbon-rich deposits on the growing SiC monocrystal.

In the Lely sublimation process known from U.S. Pat. No. 2,854,364 and AT-PS-243 for growing SiC monocrystals, fragments of SiC monocrystals are stratified in a graphite container so that they enclose a cavity (sublimation area). At a temperature of approximately 2500° C., the SiC fragments are fused together and small SiC crystals are formed from the fused fragments. In this known process, the sublimation area is not hermetically enclosed. In particular, doping gases are passed in the spaces between the SiC fragments to dope the growing SiC crystals.

German Offenlegungsschrift 24 09 005 and the corresponding U.S. Pat. No. 4,147,572 disclose a process and a device for epitaxial manufacturing of monocrystalline SiC layers consisting of SiC seed crystals, wherein a polycrystalline SiC plate is arranged as a vapor source at a distance not exceeding twice the linear dimension of the SiC plate consisting of a plurality of SiC seed crystals. A graphite stop ring, mounted on a graphite support for the seed crystals, on whose opposite side the SiC plate is arranged, is used as a spacer. One or more such growth cells comprising graphite support, seed crystals, graphite stop ring, and SiC plate, are mounted in a graphite crucible, which is placed in a furnace. The sublimation process is carried out in the furnace at a pressure of approximately 1bar to $10^{-5}$ Torr and at temperatures between 1600° C. and 2400° C. Doping gases are introduced in the graphite crucible through an opening to dope the SiC epitaxial layers.

Japanese Patent A-04-055397 discloses the use of polycrystalline β-SiC produced by chemical vapor deposition (CVD) for sublimation growing of SiC monocrystals.

In another device, known from U.S. Pat. No. 5,288,326 for producing SiC monocrystals, solid SiC particles are obtained in a reaction chamber from a gas mixture containing silane, propane, and hydrogen as main components, which drop into a sublimation chamber and are evaporated there at temperatures between 2000° C. and 2400° C. The sublimated SiC is grown on a seed crystal.

SUMMARY OF THE INVENTION

The object of this invention is to provide a process and a device for sublimation growing of SiC monocrystals with an improved crystal quality compared to the related art.

This object is achieved according to the invention through a process with the features of claim 14 and a device with the features of claim 16. At least one reaction chamber, surrounded by a gas-tight wall, is provided. The wall of the at least one reaction chamber is made of silicon carbide (SiC) obtained by chemical vapor deposition (CVD), at least on its inside facing the reaction chamber. This silicon carbide, forming at least the inside of the reaction chamber wall, is provided at least in a sublimation area of the wall used as storage area (vapor source) for the sublimation process. The portion of the silicon carbide provided as storage is at least partially sublimated by heating. The sublimated silicon carbide is grown as a silicon carbide monocrystal on a seed crystal. Since the inside of the reaction area wall is made of silicon carbide, the stoichiometric relationship between silicon (Si) and carbon (C) in the SiC monocrystal to be grown is virtually no longer influenced by the wall. High-purity SiC can be obtained with a CVD process. Therefore contamination of the SiC monocrystal during sublimation growth can also be reduced by using SiC obtained by a CVD process at least for the inside of the wall.

Advantageous refinements and embodiments of the invention and the device are presented in the dependent claims.

The stoichiometric relationship between silicon (Si) and carbon (C) in silicon carbide does not deviate from 1 by more than approximately 5%, at least in the sublimation area of the wall. The proportion of unintentional contamination in the silicon carbide of the wall is preferably not much higher than $10^{15}$ cm$^{-3}$.

The silicon carbide of the reaction chamber wall, in particular in the sublimation area, is preferably at least largely polycrystalline or at least largely amorphous, which allows higher growth rates to be set in the CVD process.

In an advantageous embodiment, the wall is made from prefabricated modules. The modules are preferably joined in a gas-tight manner using elemental silicon.

The at least one seed crystal can be arranged in the at least one reaction chamber or it can form part of the reaction chamber wall.

In another embodiment of the device, the at least one reaction chamber has means for adjusting a temperature sufficient for sublimating SiC in the sublimation area, as well as a certain temperature distribution between the sublimation area and the seed crystal.

BRIEF DESCRIPTION OF THE DRAWINGS

To further explain the invention, reference is made to the drawing, where.

Similar parts are denoted with the same symbols.

DETAILED DESCRIPTION OF THE INVENTION

Figure 1:
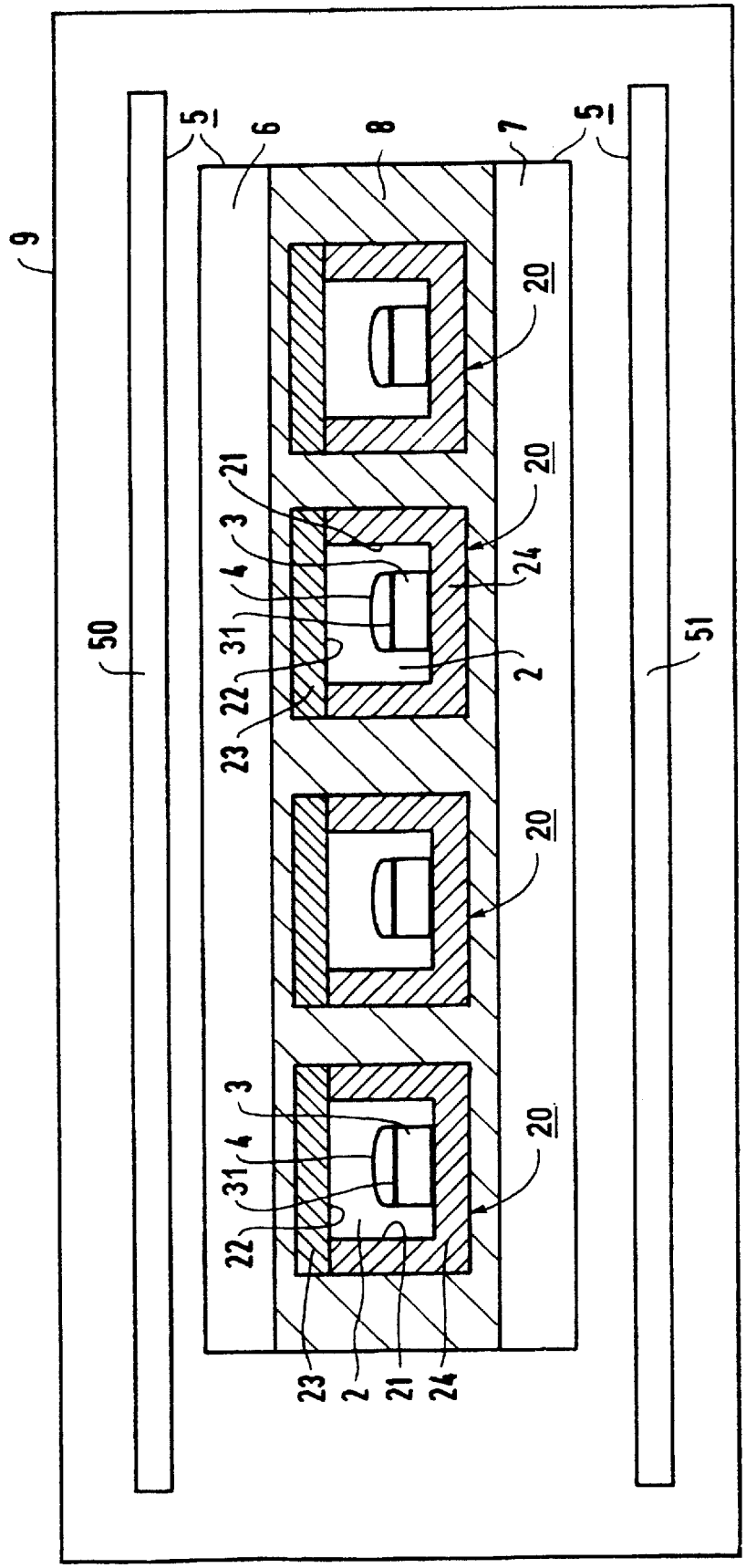
FIG. 1 schematically shows the cross section of an embodiment of the device for producing SiC monocrystals.

FIG. 1 shows a plurality of reaction chambers 2, seed crystals 3 located in reaction chambers 2, SiC monocrystals 4 being grown on crystallization surfaces 31 of seed crystals 3, thermal means 5, two individual heating devices 50 and 51, two susceptors 6 and 7, a heat insulation 8, a container 9, walls 20 surrounding reaction chambers 2, insides 21, facing reaction chamber 2, of each wall, a sublimation area 22 of these wall insides 21, and two modules 23 and 24 forming a wall 20.

Each reaction chamber 2 is entirely and hermetically enclosed by the respective wall 20. Therefore, no gas transport may take place through wall 20. Wall 20 of each reaction chamber 2 is made of silicon carbide, at least on its inside 21.

In the embodiment illustrated, wall 20 comprises two modules 23 and 24. Module 24 has, for example, the shape of a cylindrical or rectangular pot and may in turn comprise a plurality of individual modules. Module 23 preferably has a plate-shaped design and can be placed on pot-shaped module 24 as a cover, so that a closed cavity is obtained between the two modules 23 and 24 forming a reaction chamber 2. Modules 23 and 24 are gas-impermeable, i.e., in particular non-porous, and bonded to one another in a gas-tight manner. For example, modules 23 and 24 can be bonded by pre-sintering, preferably in vacuum at temperatures typically between 1500° C. and 2200° C. Modules 23 and 24 can be solid bodies made of SiC or also composites made of SiC and another refractory material such as graphite. The silicon of modules 23 and 24 is obtained by chemical vapor deposition (CVD). SiC with a relatively small amount of impurities can be obtained using CVD. The proportion of undesirable foreign atoms (impurities) in modules 23 and 24 is generally less than $10^{15}$ cm$^{-3}$ and can even be set not to exceed approximately $10^{13}$ cm$^{-3}$. Therefore the SiC monocrystal 4 being grown also has a similarly high purity.

At least one seed crystal 3 is placed in each reaction chamber 2, for example, as illustrated, on the bottom of pot-shaped module 24. The at least one seed crystal 3 can, however, also form part of wall 20. For example, the bottom of module 24 can partially formed by the at least one seed crystal 3. A surface of seed crystal 3, facing reaction chamber 2, forms the crystallization surface 31 for the SiC monocrystal 4.

Wall 20 is now brought to a temperature sufficient for the desired sublimation rate, at least in its sublimation area 22, using thermal means 5, and a desired temperature distribution between sublimation area 22 and seed crystal 3 is set. The solid SiC of sublimation area 22 is thus sublimated, at least partially, and the sublimated SiC in the gaseous phase is transported from sublimation area 22 to seed crystal 3 where it crystallizes as SiC monocrystal 4. The SiC of sublimation area 22 of wall 20 thus has, in addition to its function as a component of wall 20, also the function of a storage area (source) for the sublimation process. The process temperatures are set preferably between 1600° C. and 2400° C. The temperature gradient between sublimation area 22 and seed crystal 3 is preferably set between 1° C./cm and approximately 25° C./cm.

Preferably a SiC monocrystal is used as seed crystal 3, particularly of the 4H, 6H, or 3C polytype. If the carbon side of the SiC seed crystal 3 is used as the crystallization surface 31, a SiC monocrystal of the 4H polytype will be grown. If the crystal is grown on the silicon side of seed crystal 3, the SiC monocrystal 4 grown is of the 6H polytype. The pressure in reaction chamber 2 can be set between almost vacuum to above atmospheric pressure and is normally set not to considerably exceed 2 bar. Hydrogen gas or an inert gas or a mixture of at least two of these gases is used for setting the pressure by filling the previously evacuated reaction chamber 2 with the respective gases.

Although a plurality of reaction chambers 2 are illustrated in FIG. 1, the device may, of course, also consist of a single reaction chamber 2. Furthermore, a plurality of seed crystals 3 can also be provided in each reaction chamber 2.

Thermal means 5 can be configured in different manners and may comprise one or more inductive or resistive heaters and heat-insulating materials for setting a temperature distribution in wall 20, in reaction chamber 2, and on seed crystal 3. In the embodiment illustrated in FIG. 1, thermal means 5 comprise first heating device 50, second heating device 51, two susceptors 6 and 7, and heat insulation 8. The at least one reaction chamber 2 is arranged within heat insulation 8. In the embodiment illustrated, reaction chambers 2 are arranged next to one another in a common heat insulation 8. Heat insulation 8 comprises a heat-insulating material with a predefined thermal conductivity, which preferably reacts chemically with wall 20 of reaction chamber 2 to only a negligible degree, for example, SiC or graphite powder or a graphite foam. First heating device 50 and first susceptor 6 are jointly assigned to sublimation areas 22 of walls 20 of reaction chambers 2 to receive the energy and forward it to sublimation area 22. The second heating device 51 and second susceptor 7 are jointly assigned to the sides of walls 20 of reaction chambers 2 facing away from sublimation areas 22. Susceptors 6 and 7 may be omitted, in particular if heating devices 50 and 51 are resistive heaters. The heat outputs of the two heating devices 50 and 51 can preferably be controlled independently. Thus a desired temperature distribution can be set for the sublimation process in a controlled manner.

Thermal means 5 can also comprise a heater with a cylindrical shape, for example, surrounding all reaction chambers 2. In particular, this embodiment allows the temperature distribution to be adjusted by making heat insulation 8 suitably non-homogeneous or by adding an additional heat insulation on the outside facing away from reaction chamber 2 of susceptors 6 and 7.

All components of the device described so far are preferably located in containers 9.

The configuration of reaction chamber 2 and its wall 20 is not limited to the embodiment illustrated herein. Wall 20 can, in principle, comprise any modules of matching design. The shape of the modules can be determined, in particular, by sawing or etching.

Figure 2:
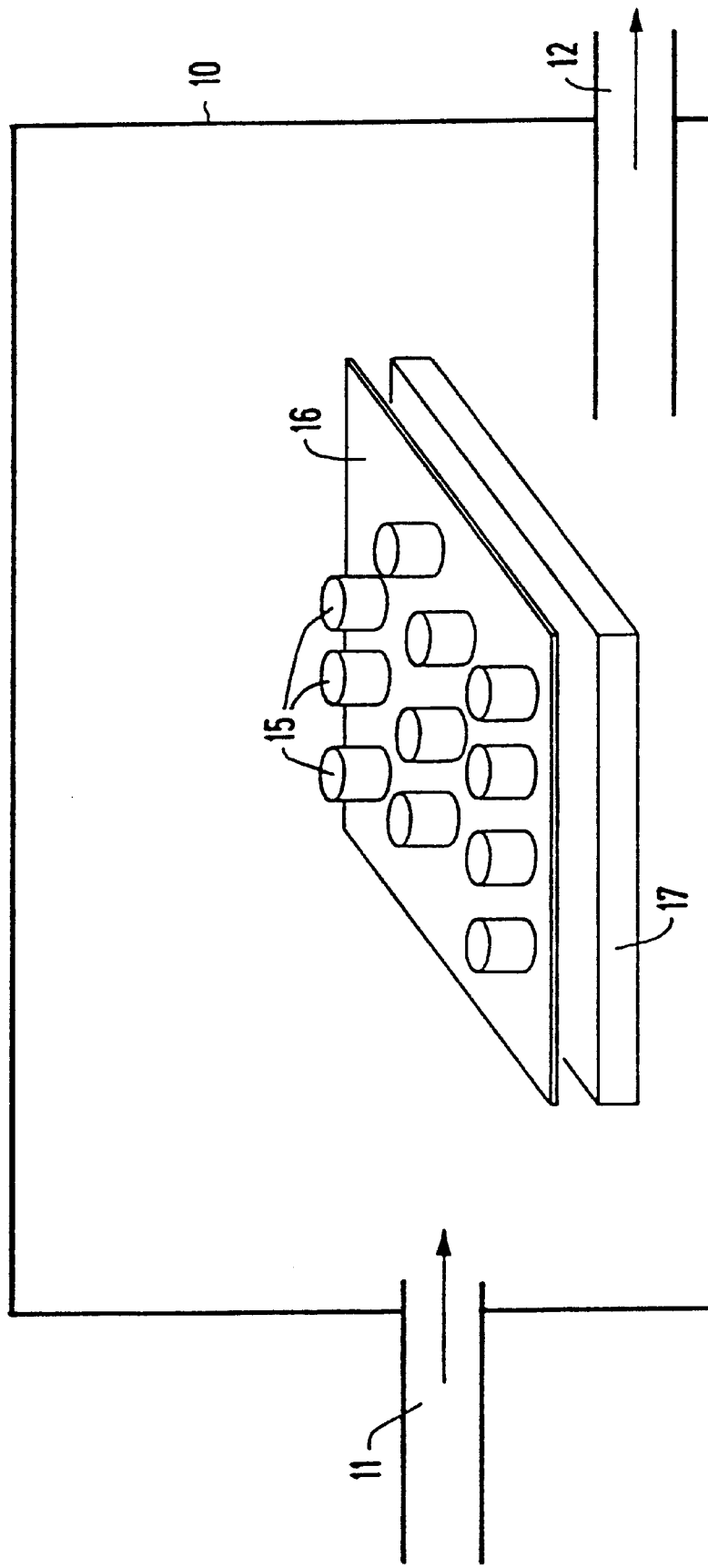
FIGS. 2 and 3 show embodiments of a device for producing reaction chamber modules.
Figure 3:
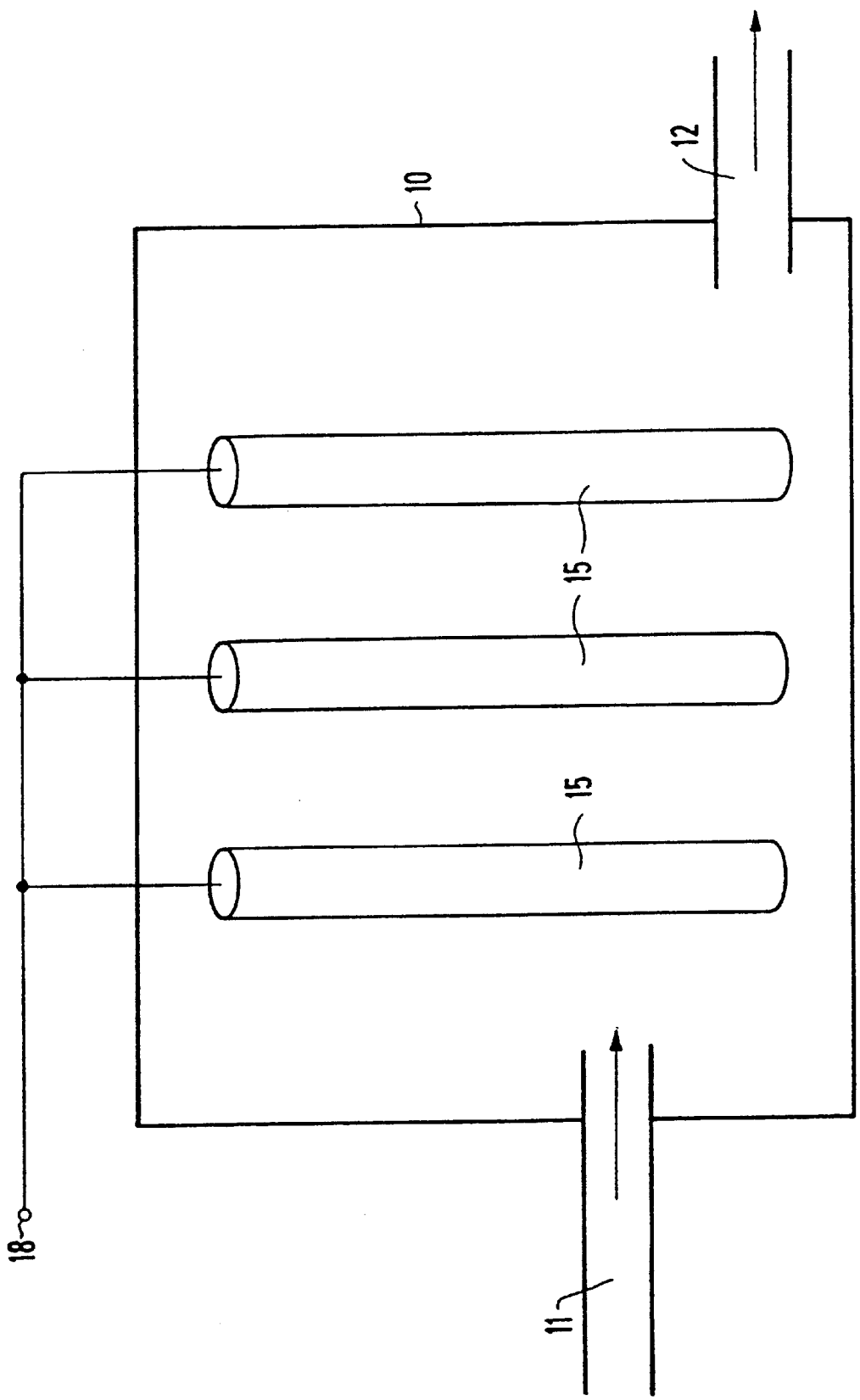

FIGS. 2 and 3 show two methods for manufacturing modules. According to FIG. 2, module substrates 15 are first placed on a carrier 16 in a CVD reactor 10. These module substrates 15 can have, for example, a cylindrical shape as illustrated, or the shape of a plate. In particular, module substrates 15 made of graphite, SiC, or Si can be used. A heating plate 17 is located under carrier 16 to heat module substrates 15 to a temperature desired for the CVD process. According to FIG. 3, preferably a plurality of module substrates 15' are placed in a CVD reactor 10. Module substrates 15' are prefabricated and can be round or rectangular rods or hollow bodies, preferably made of very pure, preferably polished, silicon, silicon carbide, or graphite. These module substrates 15' are preferably heated electrically with the help of an electrical connector 18. In both embodiments according to FIGS. 2 and 3, process gases are introduced in the CVD reactor 10 via a gas line 11. Excess process gas can be removed from the CVD reactor 10 via gas outlet 12. Silicon carbide deposits from the process gases on module substrates 15 or 15'. After the deposition of the silicon carbide, module substrates 15 or 15' can be removed from the deposited silicon carbide by melting (in the case of silicon used as substrate material or etching (in the case of silicon or graphite used as substrate materials), and the silicon carbide modules can be used for wall 20 of reaction chamber 2. Alternatively, module substrate 15 or 15', together with the additional SiC deposited, can be used as composite bodies for wall 20.

If polycrystalline or amorphous SiC is provided for the module for wall 20, a high growth rate can also be achieved with a CVD process for the SiC to be grown on module substrate 15 compared with the growth of monocrystalline SiC. The thickness of the SiC module grown on module substrate 15 is between approximately 1 mm and 10 cm if wall 20 of reaction chamber 2 is to be made of solid SiC. If wall 20 of reaction chamber 2 is to be SiC-coated only on its inside 21, at least outside sublimation area 22, a thin SiC layer grown on module substrate 15 is sufficient.

CVD processes known per se using process gases such as alcanes (e.g., methane, propane, butane) and halogenated hydrosilicons (e.g., $SiH_4$, $SiHCl_3$, or $SiH_2Cl_2$), or also methyltrichlorosilane, with the atomic proportions of silicon (Si) and carbon (C) being, or set to be, at least approximately the same, and carrier gases such as hydrogen or an inert gas. Preferably the composition of the process gases is set as a function of the process temperature on the module substrate, which may generally vary between 150° C. and 1600° C., preferably between 300° C. and 1400° C., and of the desired growth rate so that the chemical composition of the SiC being grown on module substrate 15 does not differ from the exact stoichiometric composition of SiC by more than 5%, which means that the deviation of the Si/C ratio from 1 is not more than 5%, i.e., $0.95 \leq Si/C \leq 1.05$. Basically amorphous SiC is generally obtained at substrate temperatures of typically between 150° C. and 300° C., while basically polycrystalline SiC is produced at higher substrate temperatures of typically between 500° C. and 950° C. The CVD process can also be plasma-supported or photo-stimulated to achieve higher growth rates.

In a special embodiment, silicon carbide can be provided with doping substances (intentional impurities) at least in the sublimation area 22 of wall 20, in order to dope the growing SiC monocrystal 4. Acceptors such as aluminum or boron, donors such as nitrogen or phosphorus, or also compensating deep impurity donors such as vanadium can be used. Such doping substances can be added in a known manner in the CVD process for manufacturing SiC modules.

Figure 4:
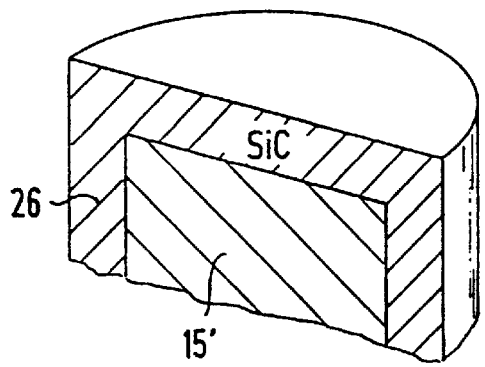
FIGS. 4 and 5 show examples of reaction chamber module production.
Figure 5:
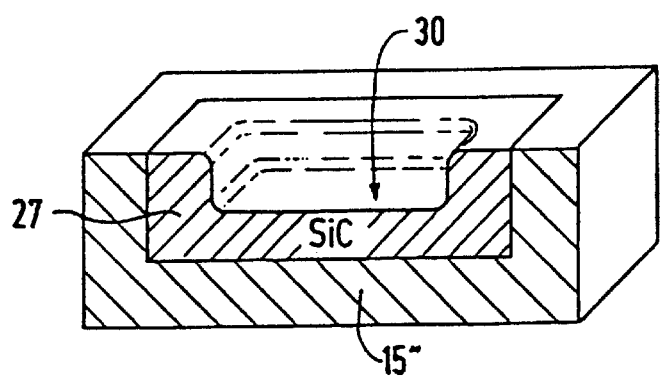

FIGS. 4 and 5 show two other possibilities for manufacturing modules for wall 20 of reaction chamber 2.

In the embodiment of FIG. 4, a circular disk-shaped module substrate 15' is provided, on which a SiC layer is deposited by a CVD process. Thus a round, pot-shaped module 26 is formed as the negative shape of module substrate 15', corresponding to a hollow cylinder with a bottom.

In the embodiment of FIG. 5, a SiC layer is deposited by CVD into a rectangular recess 30 made in an equally rectangular module substrate 15". Depending on the deposition time and therefore the SiC layer thickness, modules 27 of different shapes can be obtained. In the embodiment illustrated in FIG. 5, the Si layer does not fill the entire recess 30, so that a tub-shaped SiC module 27 with a rectangular section is obtained. In the two embodiments of FIGS. 4 and 5, the module substrate 15' or 15" can be removed in a subsequent process step, and the remaining module 26 or 27 can be used for wall 20 of reaction chamber 2. In the embodiment of FIG. 5, module substrate 15" can, however, remain joined to module 27 and be used as a composite for wall 20 of reaction chamber 2. Module 27 obtained from SiC forms then the inside of wall 20.

Figure 6:
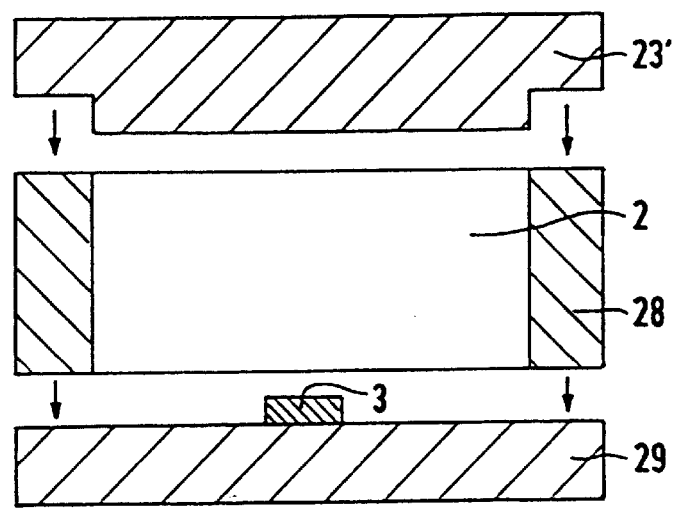
FIGS. 6 through 10 show examples of reaction chamber wall production.

In the embodiment of FIG. 6, wall 20 of reaction chamber 2 is formed by three modules 23', 28, and 29, preferably made entirely of SiC produced by a CVD process. Module 29 has seed crystal 3 as the bottom. A hollow cylindrical (tube-shaped) module 28 is placed on this bottom 29. Finally a flange-shaped module 23', whose edges cover the corresponding edges of module 28, is placed on module 28. Such a flange-shaped module 23' can be manufactured, for example, using a module substrate 15" according to FIG. 5 by depositing the SiC on module substrate 15" in such a thickness as to fill recess 30 completely and by additionally depositing SiC on the remaining surface of module substrate 15".

Figure 7:
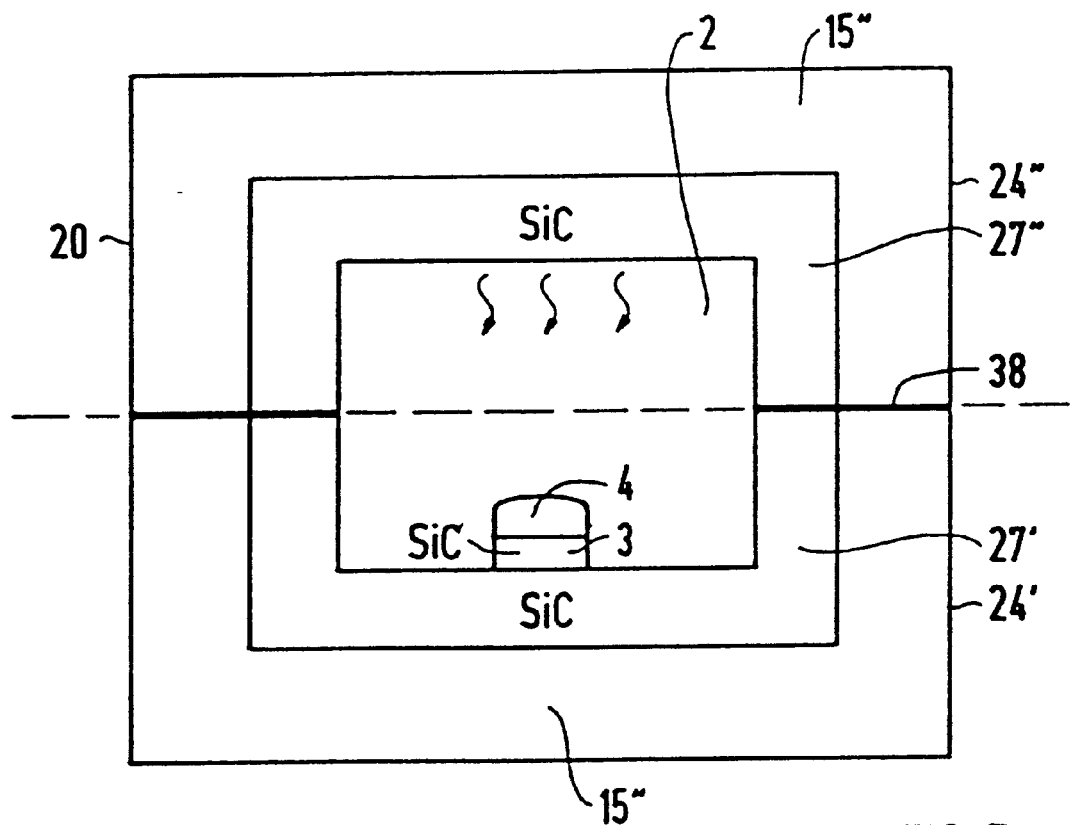

FIG. 7 shows a reaction chamber whose wall 20 is formed by two modules 24' and 24" of identical design and bonded together. The two modules 24' and 24" are bonded symmetrically in relation to a mirror plane defining bonding plane 38. Each one of modules 24' and 24" has a pot-shaped design and consists of an external part and an internal part made of SiC as in the embodiment of FIG. 5. The external part of module 24' can be made of carbon (graphite), in particular, and corresponds to module substrate 15" of FIG. 5. The at least one seed crystal 3, on which the SiC monocrystal 4 is grown from sublimated SiC, in particular from SiC module 27' of the upper module 24", is located on SiC module 27' of the bottom module 24'. 416

Figure 10:
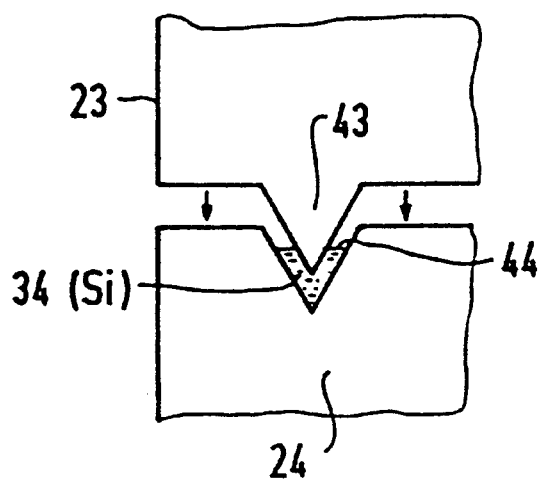
Figure 8:
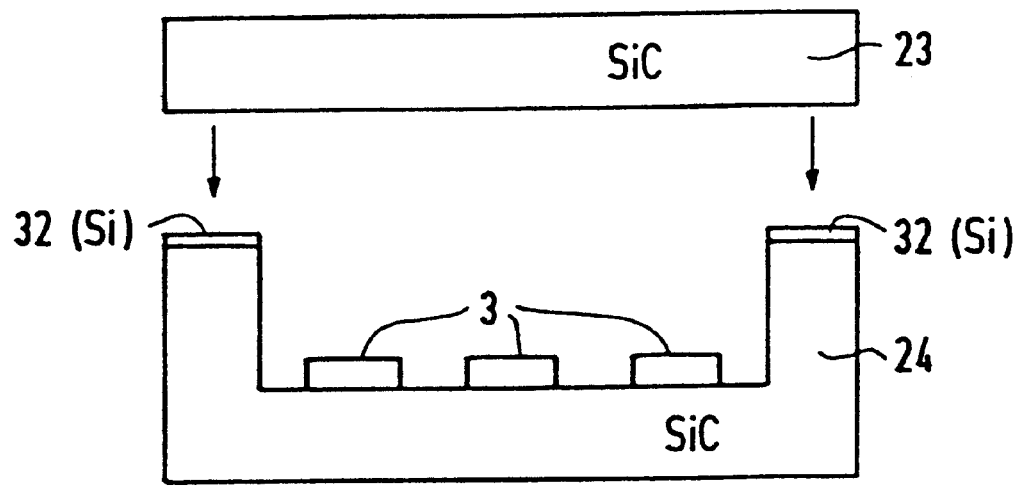
Figure 9:
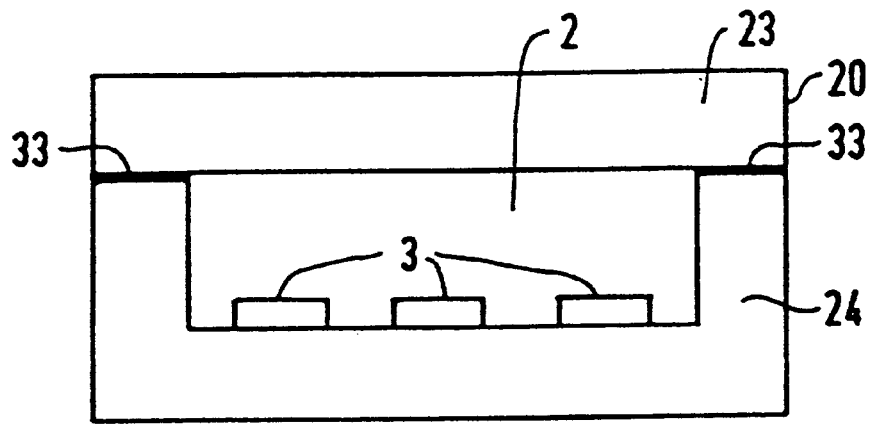

FIGS. 8 through 10 shows particularly advantageous embodiments for bonding the modules to form the wall of the reaction chamber. In these embodiments, elemental silicon is used for bonding the modules.

In the embodiment of FIG. 8, at least one contiguous piece of silicon 32 is located on a pot-shaped module 24 made of SiC, on the bonding surface with another module 23 made of SiC. The piece of silicon 32 can be, in particular, an annular plate or a silicon layer deposited from module 24. Module 23 is located on the piece of silicon 32 and in a furnace the entire arrangement is brought to a temperature that is higher than the melting point (1410° C.) of silicon. After a certain time, a solid, gas-tight bonding layer 33 is formed from the liquefied silicon between the two modules 23 and 24. The reaction chamber thus formed with wall 20 is illustrated in FIG. 9.

FIG. 10 shows a specific embodiment where module 23 has a projection 43, engaging in a matching groove 44 in module 24. Groove 44 of module 24 is filled with silicon powder 34 and module 23 is set on module 24 so that projection 43 engages in groove 44. After heating to a temperature above the melting point of silicon, a reliable, gas-tight bond is formed between the two modules 23 and 24. An advantage of this embodiment consists of the fact that groove 44 is particularly easy to fill with silicon powder 34. Silicon powder can, of course, also be used for bonding modules such as those of FIG. 8 or FIG. 9. A well-defined gas atmosphere can be established in reaction chamber 2 using the silicon powder, which is gas-permeable prior to being heated, particularly prior to sealing.

What is claimed is:

1. A process for manufacturing silicon carbide monocrystals, comprising the steps of:
   a) providing at least one reaction chamber (2) hermetically enclosed by a wall (20), the wall (20) being made of silicon carbide obtained by chemical vapor deposition (CVD) at least on its inside (21) facing the reaction chamber (2), and b) sublimating and growing at least part of the silicon carbide of the wall (20) on a seed crystal (3) as a silicon carbide monocrystal (4), wherein the wall (20) of the at least one reaction chamber (2) is made of prefabricated modules (23, 24).

2. The process according to claim 1, wherein elemental silicon is used for bonding modules (23, 24) in a gas-tight manner.

3. A device for manufacturing silicon carbide monocrystals comprising:

a) at least one reaction chamber (2) hermetically enclosed by a wall (20), the wall (20) being made of silicon carbide obtained by chemical vapor deposition (CVD) at least on its inside (21) facing the reaction chamber (2), b) means for arranging a seed crystal (3) so that a crystallization surface (9) of the seed crystal (3) for growing a silicon carbide monocrystal (4) faces the reaction chamber (2), and c) prefabricated modules (23, 24, 25) forming the wall (20).

4. The device according to claim 3, wherein the means for arranging the seed crystal (3) is provided in the at least one reaction chamber (2).

5. The device according to claim 3, wherein the seed crystal (3) is made of silicon carbide and forms part of the wall (20) of the reaction chamber (2).

6. The device according to claim 3, wherein the modules (23, 24) are bonded together in a gas-tight manner with elemental silicon.

7. The device according to claim 3, wherein the silicon carbide which makes up the wall (20) is largely polycrystalline silicon carbide.

8. The device according to claim 3, wherein the silicon carbide which makes up the wall (20) is largely amorphous silicon carbide.

9. The device according to claim 3, wherein the stoichiometric relation between silicon (Si) and carbon (C) in the silicon carbide does not differ from 1 by more than approximately 5% at least in a sublimation area (22) of the wall (20).

10. The device according to claim 1, wherein the at least one reaction chamber (2) has thermal means (50, 51, 6, 7, 8) for heating and sublimating at least part of the silicon carbide in a sublimation area (22) of the wall (20) and for setting a process temperature between approximately 1600° C. and approximately 2400° C. and for setting a temperature gradient between the sublimation area (22) and the seed crystal (3) between approximately 1° C./cm and approximately 25° C./cm in the at least one reaction chamber (2).

11. The device according to claim 3, wherein the proportion of impurities in the silicon carbide of the wall (20) does not substantially exceed $10^{15}$ cm$^{-3}$.

* * * * *